United States Patent
Drobnitzky

(10) Patent No.: US 6,917,200 B2
(45) Date of Patent: Jul. 12, 2005

(54) MAGNETIC RESONANCE TOMOGRAPHY DEVICE HAVING A NOISE-SUPPRESSING FUNCTION BY DAMPING MECHANICAL VIBRATIONS

(75) Inventor: Matthias Drobnitzky, Spardorf (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 10/488,495

(22) PCT Filed: Mar. 3, 2003

(86) PCT No.: PCT/DE02/03204

§ 371 (c)(1),
(2), (4) Date: Mar. 2, 2004

(87) PCT Pub. No.: WO03/025609

PCT Pub. Date: Mar. 27, 2003

(65) Prior Publication Data

US 2004/0196041 A1 Oct. 7, 2004

(30) Foreign Application Priority Data

Sep. 3, 2001 (DE) .......................... 101 43 048

(51) Int. Cl.⁷ ................................ G01V 3/00
(52) U.S. Cl. ...................... 324/318; 324/322
(58) Field of Search ............... 324/318, 322, 324/300, 307, 309

(56) References Cited

U.S. PATENT DOCUMENTS

| 4,583,752 A | 4/1986 | Breitbach |
| 4,954,781 A | 9/1990 | Hirata |
| 5,390,892 A * | 2/1995 | Platus ................ 248/619 |
| 5,793,210 A | 8/1998 | Pla et al. |
| 6,107,799 A | 8/2000 | Sellers et al. |
| 6,549,010 B2 * | 4/2003 | Roozen et al. ........ 324/318 |
| 6,552,543 B1 * | 4/2003 | Dietz .................. 324/318 |
| 6,774,633 B2 * | 8/2004 | Wang et al. ........... 324/318 |

FOREIGN PATENT DOCUMENTS

| DE | 34 10 473 A1 | 10/1984 |
| DE | 197 34 138 A1 | 2/1998 |
| DE | 197 22 481 A1 | 12/1998 |
| DE | 198 02 359 A1 | 7/1999 |
| DE | 198 38 390 A1 | 3/2000 |

OTHER PUBLICATIONS

R.S. Lakes et al.; Extreme Damping in Composite Materials with Negative Stiffness Inclusions; NATURE; Mar. 29, 2001; vol. 410; S. 565–567.

R.S. Lakes; Extreme Damping in Composite Materials with a Negative Stiffness Phase; Phys Rev Lett; Physical Review Letters; Mar. 26, 2001.

* cited by examiner

Primary Examiner—Louis Arana
(74) Attorney, Agent, or Firm—Schiff Hardin LLP

(57) ABSTRACT

It is possible to suppress noise by intensively damping mechanical vibrations in MRT devices, especially gradient coils and magnet vessels, using compound materials containing centers of negative stiffness. The invention relates to a core spin tomography device, wherein the vibrations of the device components, which can in many aspects have a negative effect on the entire system, can be reduced or the noise transmission paths can be reduced. The core spin tomography device has a basic field magnet which is surrounded by a magnet envelope which surrounds and defines an inner area, a gradient coil system being disposed inside the inner area. Damping elements made of a material having a negative stiffness are arranged on an inner side of the magnet envelope defining the inner area in order to absorb acoustic vibrations which are produced during switching of the gradient coil system.

8 Claims, 2 Drawing Sheets

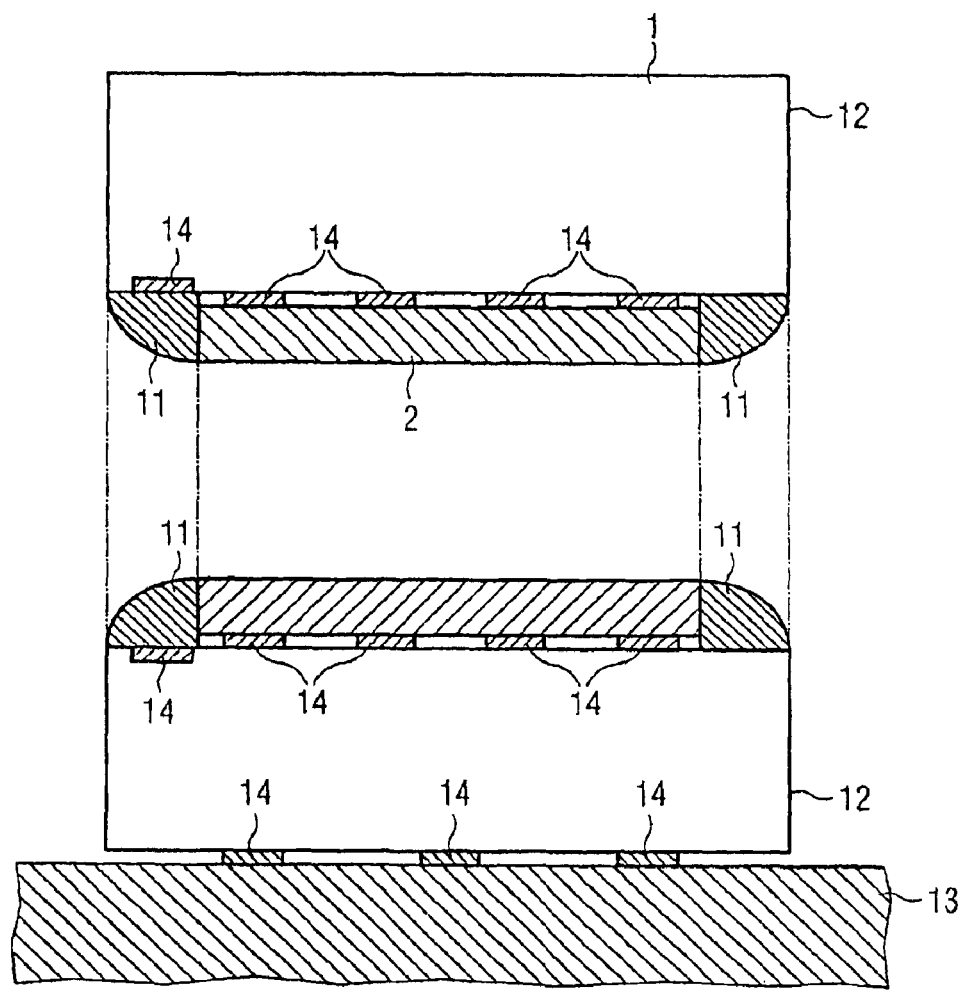

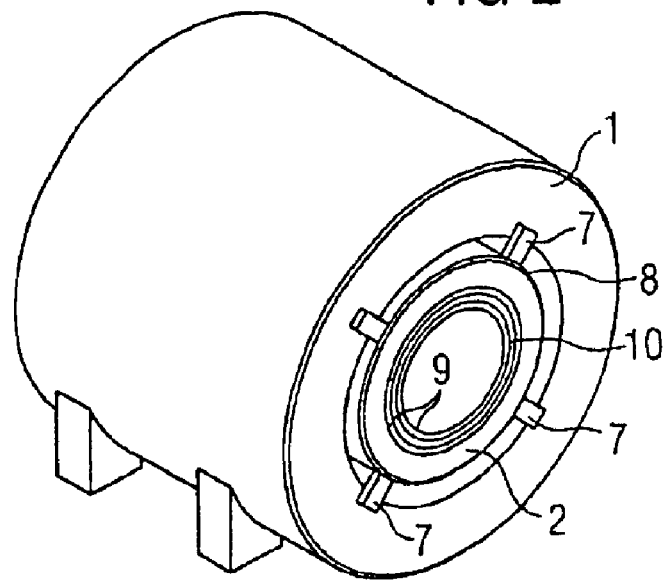
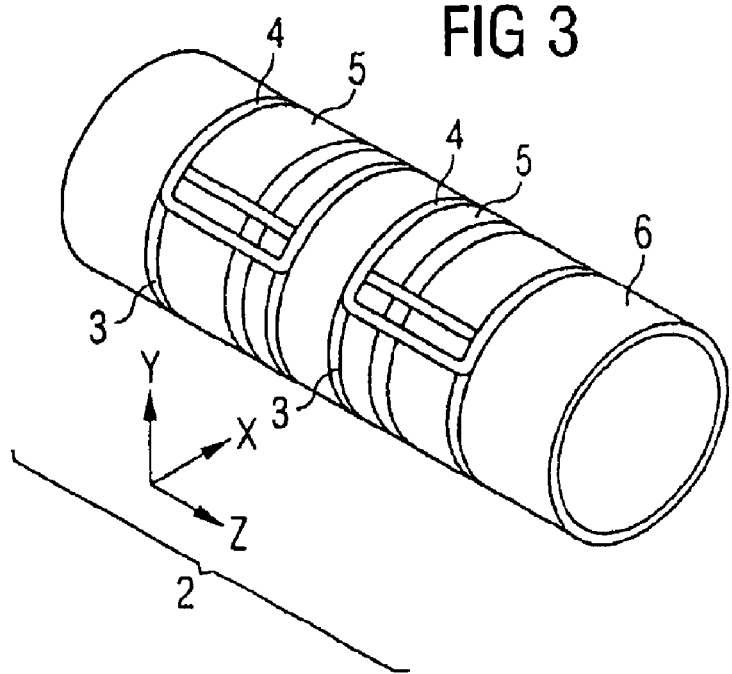

MAGNETIC RESONANCE TOMOGRAPHY DEVICE HAVING A NOISE-SUPPRESSING FUNCTION BY DAMPING MECHANICAL VIBRATIONS

BACKGROUND OF THE INVENTION

The present invention relates in general to NMR tomography as it is used in medicine for examining patients. In this case, the present invention relates particularly to an NMR tomography machine with reduced vibrations of machine components that negatively influence many aspects of the overall system.

NMR is based on the physical phenomenon of nuclear spin resonance and has been used successfully as an imaging method for over 15 years in medicine and in biophysics. In this method of examination, the object is exposed to a strong, constant magnetic field. This aligns the nuclear spins of the atoms in the object, which were previously oriented irregularly. Radio-frequency waves can now excite these "ordered" nuclear spins to a specific oscillation. In NMR, this oscillation generates the actual measuring signal that is picked up by way of suitable receiving coils.

Due to the use of inhomogeneous magnetic fields, generated by gradient coils, it is possible in this case to code the measurement object spatially in all three spatial directions. The method permits a free choice of the layer to be imaged, as a result of which it is possible to take tomographic images of the human body in all directions. NMR as laminography in medical diagnostics is distinguished first and foremost as a "non-invasive" method of examination by a versatile contrast capability. NMR has developed into a method far superior to x-ray computer tomography (CT) because of the excellent ability to display the soft tissue. Currently, NMR is based on the application of spin echo and gradient echo sequences that permit an excellent image quality with measuring times in the range of seconds to minutes.

Continuous technical development of the components of NMR machines, and the introduction of high-speed imaging sequences has opened up ever more fields of use for NMR in medicine. Real time imaging for supporting minimally invasive surgery, functional imaging in neurology and perfusion measurement in cardiology are only a few examples.

The basic design of one of the central parts of such an NMR machine is illustrated in FIG. 2. It shows a superconducting basic field magnet 1 (for example, an axial superconducting air-coil magnet with active stray field screening) which generates a homogeneous magnetic basic field in an inner space. The superconducting basic field magnet 1 comprises the inner space coils which are located in liquid helium. The basic field magnet is surrounded by a two-shell tank which is made from stainless steel, as a rule. The inner tank, which contains the liquid helium and serves in part also as winding body for the magnet coils is suspended at the outer tank, which is at room temperature, via fiber-glass-reinforced plastic rods which are poor conductors of heat. A vacuum prevails between inner and outer tanks. The inner and outer tanks are referred to as a magnet vessel.

The cylindrical gradient coil 2 in the inner space of the basic field magnet 1 is inserted concentrically into the interior of a support tube by way of support elements 7. The support tube is delimited externally by an outer shell 8, and internally by an inner shell 9. The function of the layer 10 will be explained below.

The gradient coil 2 has three-part windings that generate a gradient field, which is proportional to the current impressed in each case, and are spatially perpendicular to one another in each case. As illustrated in FIG. 3, the gradient coil 2 comprises an x coil 3, a y coil 4 and a z coil 5 which are respectively wound around the coil core 6 and thus generate a gradient field, expediently in the direction of the Cartesian co-ordinates x, y and z. Each of these coils is fitted with a dedicated power supply unit in order to generate independent current pulses with accurate amplitudes and timing in accordance with the sequence programmed in the pulse sequence controller. The required currents are at approximately 250 A.

Located inside the gradient coil is the radio-frequency coil (RF resonator or antenna). Its task is to convert the RF pulses output by a power transmitter into an alternating electromagnetic field for the purpose of exciting the atomic nuclei, and subsequently to convert the alternating field emanating from the preceding nuclear moment into a voltage supplied to the reception path.

Since the gradient switching times are to be as short as possible, current rise rates of the order of magnitude of 250 kA/s are necessary. In an exceptionally strong magnetic field such as is generated by the basic field magnet 1 (typically between 0.2 and 1.5 Tesla), such switching operations are associated with strong mechanical vibrations because of the Lorentz forces occurring in the process. All system components which are mechanically coupled to the gradient system (housing, covers, tank of the basic field magnet and magnet casing, respectively, RF body coil etc.) are excited to forced vibrations.

Since the gradient coil is generally surrounded by conductive structures (for example, a magnet vessel made from stainless steel), the pulsed fields start in these eddy currents which exert force effects on these structures due to interaction with the basic magnetic field, and likewise excite these structures to vibrations.

These vibrations of the various NMR machine components act negatively in many ways on the NMR system:

1. Strong air-borne noise is produced, which constitutes an annoyance to the patient, the operating staff and other persons in the vicinity of the NMR system.
2. The vibrations of the gradient coil and of the basic field magnet, and their transmission to the RF resonator and the patient couch in the inner space of the basic field magnet and/or the gradient coil, are expressed in inadequate clinical image quality which can even lead to misdiagnosing (for example, in the case of functional imaging, fMRI).
3. If the vibrations of the outer tank are transmitted to the inner tank via the GRP rods, or the superconductor itself is excited to vibrate, increased helium damping occurs—in a way similar to in an ultrasonic atomizer—in the interior of the tank, thus necessitating the subsequent supply of a correspondingly larger quantity of liquid helium, and this entails higher costs.
4. High costs arise also due to the need for a vibration-damping system set-up—similar to an optical table—in order to prevent transmission of the vibrations to the ground, or vice versa.

In the prior art, the transmission of vibrational energy between the gradient coil and the further components of the tomograph (magnet vessel, patient couch, etc.) is counteracted by the use of mechanical and/or electromechanical vibration dampers. It is customary to make use of passively acting components, for example, rubber bearings, or possibly piezo-actuators integrated in the gradient coil, which permit active counter control in regulated operation and thus reduce the amplitude of vibration of the gradient coil.

Vibrations of the magnet vessel are usually mechanically damped with respect to the gradient coil by bolsters.

The following passive measures are also usually undertaken in order to reduce the vibrations:
encapsulation of vibration source
use of thick and heavy materials
damping layers (for example, tar) applied from "outside".

In particular, the noise production path over the interior of the NMR machine, i.e., the production of noise by vibration of the gradient coil and transmission of the noise to the support tube located in the gradient coil (8, 9 FIG. 2), which emits this noise inward to the patient and the inner space 15, is blocked in accordance with U.S. Pat. No. 4,954,781 by a damping viscoelastic layer 10 (FIG. 2) in the double-ply interior of the support tube.

Furthermore, it is known to achieve the above-named blocking of the noise production path by inserting sound-absorbing "acoustic foams" into the region between support tube and gradient coil.

Thus, German Published Patent Application DE 197 22 481 A1 discloses an NMR device that has, between a magnet assembly and a gradient coil assembly, a passive acoustic damping device which is intended, firstly, to dampen vibrations and, secondly, to stiffen the gradient coil assembly. Materials named are: foam, air or other gases, liquid, gaseous or pourable insulating materials.

According to the '481 application, the action of the noise-reducing device is based essentially on the fact that the total deformation of the gradient coil assembly, and thus also the noise emission, are reduced with increasing stiffness. Full-area contact between two facing surfaces of the magnet assembly and gradient coil assembly is proposed as being particularly effective.

The experimental implementation of a material that has negative stiffness and, as such, can be advantageously used in fields where damping and stiffening properties are required at a high level is disclosed in "Lakes et Al., Extreme damping in composite materials with negative-stiffness inclusions, Nature, 29 Mar. 2001, Vol. 410, No. 6828. pages 565–567" and in "Lakes: Extreme damping in composite materials with a negative stiffness phase, Physical review letters, Mar. 26, 2001, Vol. 86, No. 13, pages 2897–2900". Both of these publications describe the physical and technical properties of the novel material, but do not disclose the technical implementation of the use of this material in a complex system such as represented by an NMR machine, for example. In general, such materials have not yet been used in NMR machines.

Nevertheless, the acoustic emission of a currently normal NMR machine continues to be very high.

SUMMARY OF THE INVENTION

It is therefore the object of the present invention further to reduce the noise transmission during operation of an NMR machine.

This object is achieved by an NMR tomography machine, comprising: a basic field magnet; a magnet casing that surrounds the basic field magnet and that surrounds and delimits an inner space; a gradient coil system being located in this inner space; and damping elements comprising a material having a negative stiffness for absorbing acoustic vibrations that are produced during switchover of the gradient coil system being provided on an inner side, delimiting the inner space, of the magnet casing.

Various embodiments of the invention are described as follows. An NMR tomography machine is provided that has a magnet body surrounded by a magnet casing that surrounds and delimits an inner space, a variant coil system being located in this inner space. Damping elements for absorbing acoustic vibrations that are produced during switchover of the gradient coil system are provided on an inner side, delimiting the inner space, of the magnet casing, the damping elements comprising, in accordance with the embodiments of the invention, a material that has negative stiffness.

Advantageously, no information on the deformation that is to be counteracted is required by the material proposed for damping in order to act in a damping fashion—in contrast to, for example, the case of active suppression of vibrations, particularly with the aid of piezo-actuators. The proposed material acts in a purely passive fashion by utilizing the appropriate material property, and not a property, resulting from design, of a technically implemented damping element.

A further substantial advantage is the possibility of producing the proposed material in a spatial-mechanically fitting form. This permits the use of the material even in very highly integrated modules such as, for example, in the gradient system. Since the damping with the aid of the proposed material operates without further control electronics, the imaging operation is not disturbed—in contrast to active suppression of vibrations in accordance with the prior art.

Thus, the transmission of vibrations of the gradient coil to the magnet vessel is advantageously suppressed, as is the transmission of vibrations of the coil to the RF resonator and the patient couch (something which entails the abovementioned disadvantages).

For the purpose likewise of absorbing acoustic vibrations, such damping elements may be advantageously arranged between cladding parts and the magnet vessel and between the magnet vessel and the bottom.

The damping elements advantageously may comprise composite bearing materials.

In particular, in this case the bearing materials can have inclusions of negative stiffness.

In a further embodiment of the invention, the dampening element material may be used for damping the vibrations inside the gradient coil itself.

The embodiment of the damping elements can be formed by different geometric shapes; plates, rings or ring segments, etc., are conceivable.

DESCRIPTION OF THE DRAWINGS

Further advantages, features and properties of the present invention will now be explained in more detail with the aid of exemplary embodiments with reference to the accompanying drawings.

FIG. 1 is a schematic section through the basic field magnet and the components of the inner space which it encloses;

FIG. 2 is a perspective illustration of the basic field magnet; and

FIG. 3 is a perspective illustration of the gradient coil with the three part windings.

DETAILED DESCRIPTION OF THE PREFERRED EMBODIMENTS

FIG. 1 shows a schematic section through the basic field magnet 1 of an NMR machine. The gradient coil 2 is located in the inner space that surrounds the basic field magnet. FIG. 1 also shows by way of example a few cladding parts 11 and the bottom 13 on which the NMR machine stands. The basic field magnet 1 includes superconducting magnet coils which are located in liquid helium, and is surrounded by a two-shell tank 12, also termed "magnet vessel".

The system illustrated schematically in FIG. 1 has the gradient coil 2 as a vibration source.

The present invention permits the transmission of noise to be reduced by the use of special damping elements 14 at specific strategic points.

The strategic points are the interfaces between the gradient coil 2 and the magnet vessel 12 or between the magnetic vessel 12 and the bottom 13, as well as between the magnet vessel 12 and the cladding parts 11.

An unregulated mechanical damping is implemented between the gradient coil 2 and the magnet vessel 12 or between the magnet vessel 12 and the bottom 13 as well as the cladding parts 11 by using materials that have negative stiffness.

This material can also be used to dampen the vibrations inside the variant coil 2 itself. In this case, the material is advantageously arranged at the location of the antinodes in order to reduce the amplitude of vibrations.

Negative stiffness means that a material reacts with a shift in the opposite direction to a deforming force. This effect differs from the property of some compressible foams of spreading unexpectedly at right angles to the direction of a strain that has occurred. A mechanical example of negative stiffness is a coiled spring clamped in a compressed fashion, with the aid of which a pressure is then exerted on another material in the direction of compression.

The capacity for technical use necessitates that this property must be stably realized.

Because of its purely passive and mechanically stable functional principle, the proposed damping is particularly well suited for use in NMR machines, particularly in gradient coils and magnet vessels. Its very high damping effect permits efficient suppression of the mechanical vibrations and thereby contributes to suppressing the undesired production of noise and/or transmission of noise.

For the purposes of promoting an understanding of the principles of the invention, reference has been made to the preferred embodiments illustrated in the drawings, and specific language has been used to describe these embodiments. However, no limitation of the scope of the invention is intended by this specific language, and the invention should be construed to encompass all embodiments that would normally occur to one of ordinary skill in the art.

The particular implementations shown and described herein are illustrative examples of the invention and are not intended to otherwise limit the scope of the invention in any way. For the sake of brevity, conventional components and aspects may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device. Moreover, no item or component is essential to the practice of the invention unless the element is specifically described as "essential" or "critical". Numerous modifications and adaptations will be readily apparent to those skilled in this art without departing from the spirit and scope of the present invention.

What is claimed is:

1. An NMR tomography machine, comprising:
   a basic field magnet;
   a magnet casing that surrounds the basic field magnet and that surrounds and delimits an inner space;
   a gradient coil system being located in this inner space;
   damping elements comprising a material having a negative stiffness for absorbing acoustic vibrations that are produced during switchover of the gradient coil system being provided on an inner side, delimiting the inner space, of the magnet casing.

2. The NMR tomography machine as claimed in claim 1, further comprising cladding parts, the damping elements being arranged between the cladding parts and the magnet vessel in order to absorb acoustic vibrations.

3. The NMR tomography machine as claimed in claim 1, wherein the damping elements are arranged between the magnet vessel and a bottom upon which the magnet vessel rests in order to absorb acoustic vibrations.

4. The NMR tomography machine as claimed in claim 1, wherein the damping elements comprise composite bearing materials.

5. The NMR tomography machine as claimed in claim 4, wherein the bearing materials have inclusions of negative stiffness.

6. The NMR tomography machine as claimed in claim 1, wherein the gradient coil has further damping elements made from material of negative stiffness.

7. The NMR tomography machine as claimed in claim 6, wherein the material is arranged at a location of the antinodes in order to reduce the amplitude of vibrations.

8. The NMR tomography machine as claimed in claim 1, wherein the damping elements are formed by geometric shapes that include at least one of plates, rings, and ring segments.

* * * * *